United States Patent
Black et al.

(10) Patent No.: US 6,748,715 B1
(45) Date of Patent: Jun. 15, 2004

(54) SAFETY UNIT

(75) Inventors: John Alexander Black, Oakly (GB); Robert David Black, Woodstock (GB)

(73) Assignee: S Black Carpenters Limited, Beckley (GB)

(*) Notice: Subject to any disclaimer, the term of this patent is extended or adjusted under 35 U.S.C. 154(b) by 0 days.

(21) Appl. No.: 09/743,365

(22) PCT Filed: Jul. 21, 1999

(86) PCT No.: PCT/GB99/02367
§ 371 (c)(1),
(2), (4) Date: Jan. 9, 2001

(87) PCT Pub. No.: WO00/04955
PCT Pub. Date: Feb. 3, 2000

(30) Foreign Application Priority Data

Jul. 24, 1998 (GB) .............................. 9816137

(51) Int. Cl.$^7$ .............................................. E04F 19/10
(52) U.S. Cl. ............................ 52/660; 52/664; 52/665; 52/DIG. 12
(58) Field of Search ........................... 52/109, DIG. 12, 52/632, 660, 645, 664, 665; 182/137, 138, 139, 140

(56) References Cited

U.S. PATENT DOCUMENTS

| | | | | |
|---|---|---|---|---|
| 2,283,050 A | * | 5/1942 | Fisher | 52/109 X |
| 2,697,845 A | * | 12/1954 | Broner | 52/109 X |
| 3,092,932 A | * | 6/1963 | Wilson | 52/645 X |
| 3,128,478 A | | 4/1964 | Beal | |
| 4,013,114 A | * | 3/1977 | Goebel | 52/109 X |
| 4,375,741 A | * | 3/1983 | Paliwoda | 52/109 X |
| 4,580,376 A | * | 4/1986 | Vinum et al. | 52/109 |
| 4,821,481 A | * | 4/1989 | Woodman | 52/664 |
| 5,069,009 A | * | 12/1991 | Suzuki | 52/664 X |
| 5,251,412 A | * | 10/1993 | de Almeida Borges | 52/109 |
| 5,657,605 A | * | 8/1997 | Sidney | 52/664 |

FOREIGN PATENT DOCUMENTS

| | | | | |
|---|---|---|---|---|
| DE | 204127 | * | 4/1906 | 52/660 |
| DE | 27 01 138 | | 7/1978 | |
| GB | 381172 | * | 9/1932 | 52/665 |
| GB | 1296528 | * | 11/1972 | 52/665 |
| GB | 2 274 664 | | 8/1994 | |
| IT | 516892 | * | 11/1956 | 52/109 |

* cited by examiner

Primary Examiner—Carl D. Friedman
Assistant Examiner—Kevin McDermott
(74) Attorney, Agent, or Firm—Davis & Bujold, PLLC

(57) ABSTRACT

A safety unit (11) in the form of a network or mesh for location across an opening to receive and restrain an object falling into the opening. The network or mesh is a trellis (12) comprising: a first array (13) of parallel rigid members (13A); a second array (14) of parallel rigid members (14A); and pivoting mechanism whereby each member (13A) of the first array (13) is pivotably attached to at least some of the members (14A) of the second array (14) so that the first and second array can be pivoted relative to one another between a first housed, configuration wherein the difference between the width (W') of the trellis (12) and the length (L') of the trellis (12) tends to a maximum; and a second, opened, configuration wherein the difference between the width (W) of the trellis (12) and the length (L) of the trellis (12) tends to a minimum. The trellis (12) is adapted for horizontal location in at least its opened configuration in a zone into or through which falling objects tend to pass by being supported at or near the periphery of the trellis (12) so as to restrain falling objects contacting the trellis (12) in a region lying within the periphery.

8 Claims, 3 Drawing Sheets

SAFETY UNIT

TECHNICAL FIELD

This invention relates to a safety unit. In particular it is concerned with a safety unit for use in building structures.

BACKGROUND ART

In the course of building a structure such as a warehouse or office building which is to have a ridged roof then once the main building structure is in place there arises the need to erect on the upper part of the structure a spaced sequence of pre-fabricated trusses for the eventual roof. These are located between the walls and then secured. However raising a truss into position and securing it accurately in place is a hazardous operation for the building operatives involved. The open structure beneath the roofing level provides little or no support or protection for such operatives when working in the vicinity of the trusses.

As a safety feature it is commonly proposed that a net be located in the structure beneath the roofing level. However a stretched out net while serving to prevent an operative falling any significant distance from the lower part of the truss down through the structure tends to restrict the freedom of operation of the operatives. In addition the provision of further structural members to the operatives (such as long roofing members to be incorporated into the roof structure between the trusses) involves dismantling the net or nets to a greater or lesser extent. As a result it is not unknown for operatives to save time by avoid using a net or nets which omission is not necessarily in their own best interests from the point of view of their safety.

DISCLOSURE OF INVENTION

According to a first aspect of the present invention there is provided a safety unit in the form of a network or mesh for location across an opening to receive and restrain an object falling into the opening characterised in that the network or mesh is in the form of a trellis comprising: a first array of parallel rigid members; a second array of parallel rigid members; and pivoting means whereby each member of the first array is pivotably attached to the majority of members of the second array so that the first and second arrays can be pivoted relative to one another between a first, housed, configuration wherein the difference between the width of the trellis and the length of the trellis tends to a maximum; and a second, opened, configuration wherein the difference between the width of the trellis and the length of the trellis tends to a minimum;

the trellis being adapted for horizontal location in at least its opened configuration in a zone into or through which falling objects tend to pass by being supported at or near the periphery of the trellis so as to retain falling objects contacting the trellis in a region lying within the periphery.

According to a first preferred version of the first aspect of the present invention the pivoting means provide for the first and second arrays to lie in a substantially common plane at least when in the housed or in the opened configurations.

According to a second preferred version of the first aspect of the present invention or of the first preferred version thereof the screen member when in the opened configuration supported at intervals around its periphery so as to provide a tensioned area of the screen member into which a falling object can fall to enable the motion of the falling object to be damped.

According to a second aspect of the present invention there is provided a method of providing for the retention of falling objects at an elevated location, such as on a building site, comprising a network or mesh for spreading across an opening through which an object could fall characterised by the steps of:

locating at the location a safety screen in the form of a trellis comprising a first and a second array of parallel rigid members;

linking the first array to the second array so that the majority of members of the first array are pivotably attached to the majority of members of the second array for movement relative to one another between a first, house, configuration wherein the difference between the width of the trellis and the length tends to a maximum; and a second, opened, configuration wherein the difference between the width of the trellis and its length is a minimum; and supporting the trellis at or near its periphery so as to retain falling objects contacting the trellis in a region lying within the periphery.

BRIEF DESCRIPTION OF THE DRAWINGS

An exemplary embodiment of the invention will now be described with reference to the accompanying drawings of a safety unit, and an example of it in use, of which.

MODE FOR CARRYING OUT THE INVENTION

Figure 1:
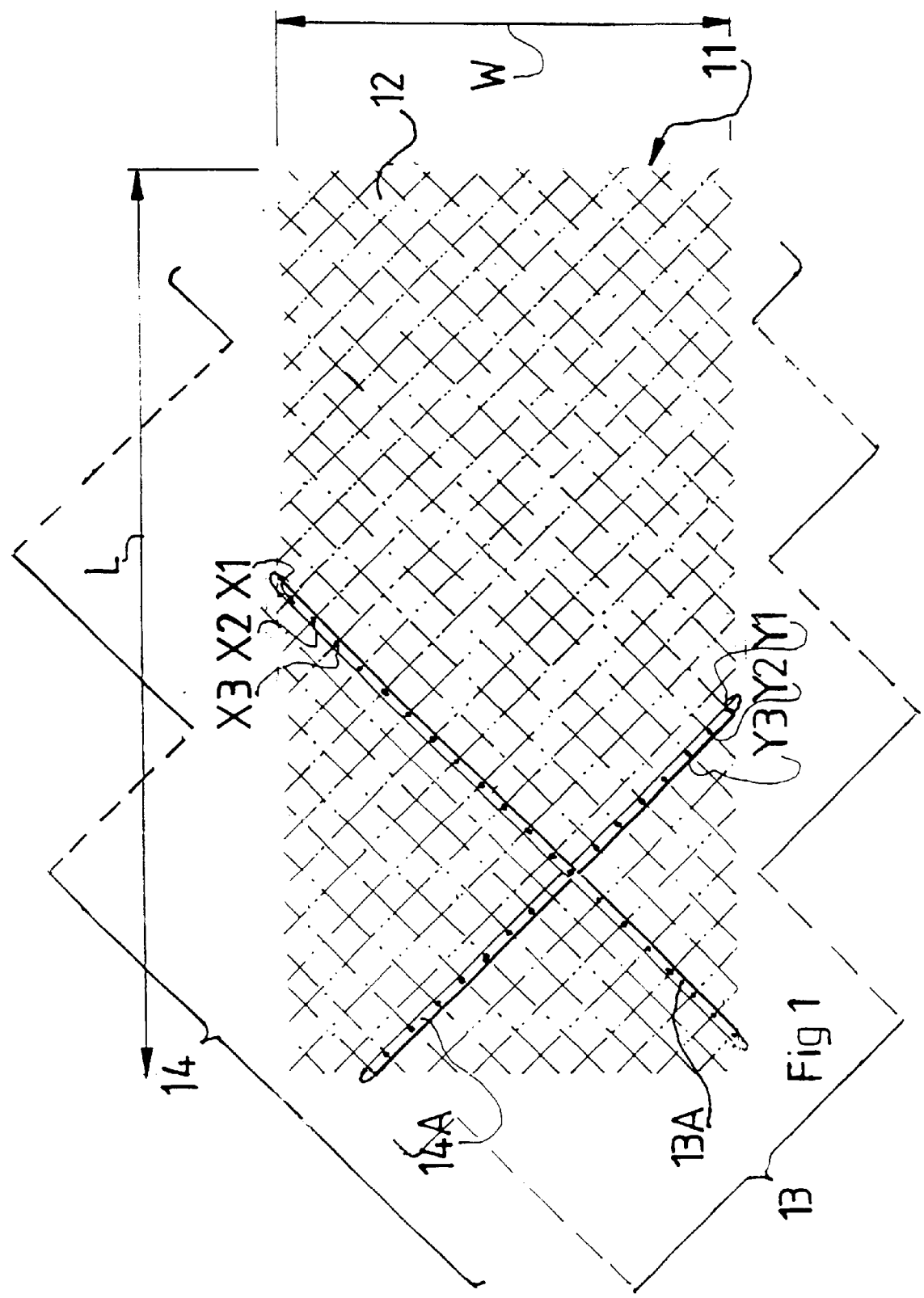
FIG. 1 is a plan view of a safety unit with its components in an opened configuration.
Figure 2:
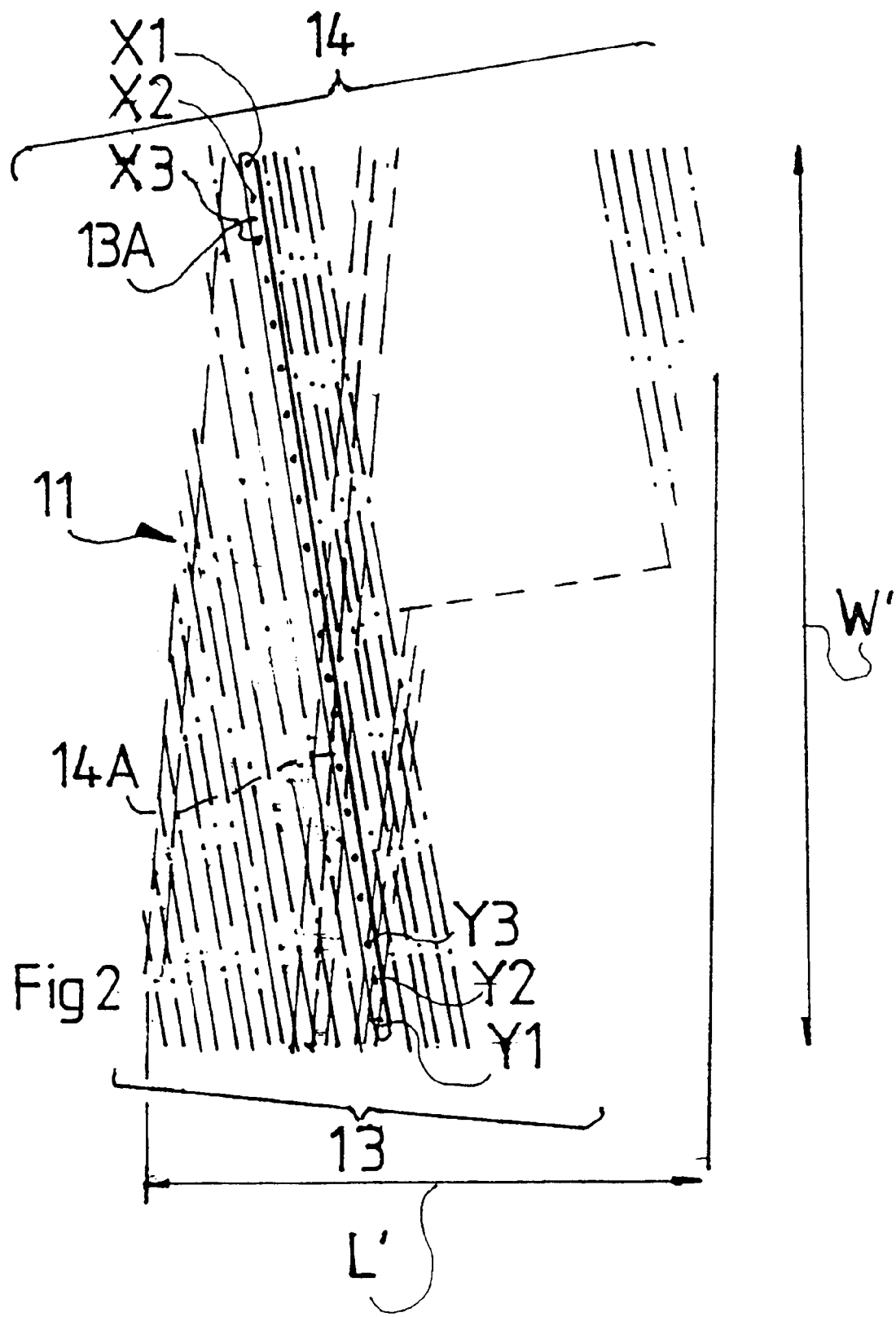
FIG. 2 is a plan view of the safety unit of FIG. 1 but with its components in a housed position.

FIGS. 1 and 2

A safety unit 11 is in the form of a diagonal trellis 12, including a first array 13 and a second array 14 of parallel members. For the sake of clarity the members in the first array 13 are shown only by centre lines except for typical member 13A. The member 13A, in the first array 13, is attached to each adjacent member of the members in the second array 14 along axis by an individual pivot pins for example X1, X2, X3. Likewise for the sake of clarity the members in the second array 14 are shown only by centre lines except for typical member 14A. The member 14A, in the second array 14, is attached to each adjacent member of the members in the first array 13 along axis by an individual pivot pins for example Y1, Y2, Y3.

Each member in each array 13, 14 is in the form of a length of plastics extrusion, typically of polypropylene, each length having a cross section in the form of a hollow square.

The pins X1 etc and Y1 etc allow the members of the arrays 13, 14 of trellis 12 to readily pivot relative to one another. The pins are of metal coated with a plastics material to resist corrosion and to allow for ready pivoting of the members relative to one another.

FIG. 1 shows the trellis 12 in a first, opened, configuration having a width W and a length L.

FIG. 2 shows the trellis 12 in its closed configuration in the form of a parallelogram. In the closed configuration the width W' is slightly less than 1.5. W (the open width of FIG. 1). Length L' in the closed configuration is considerably less than length L in the open configuration. This ensures that the unit 11 in its closed configuration provides a compact and readily handled configuration for the unit. As was the case in FIG. 1 for the sake of clarity only the typical members 13A in first array 13 and members 14A in second array 14 are shown. The remaining members in the two arrays 13, 14 take up corresponding compact relative positions.

It is emphasised that there are no separate boundary members at the periphery of the trellis. The ends of each member collectively serve to define the local boundary of the trellis.

For storage and transportation the trellis 12 is kept in its closed configuration as shown in FIG. 2 wherein the trellis 12 is readily manhandled through a building S to the required location and then readily moved into position and opened (and closed).

Figure 3:
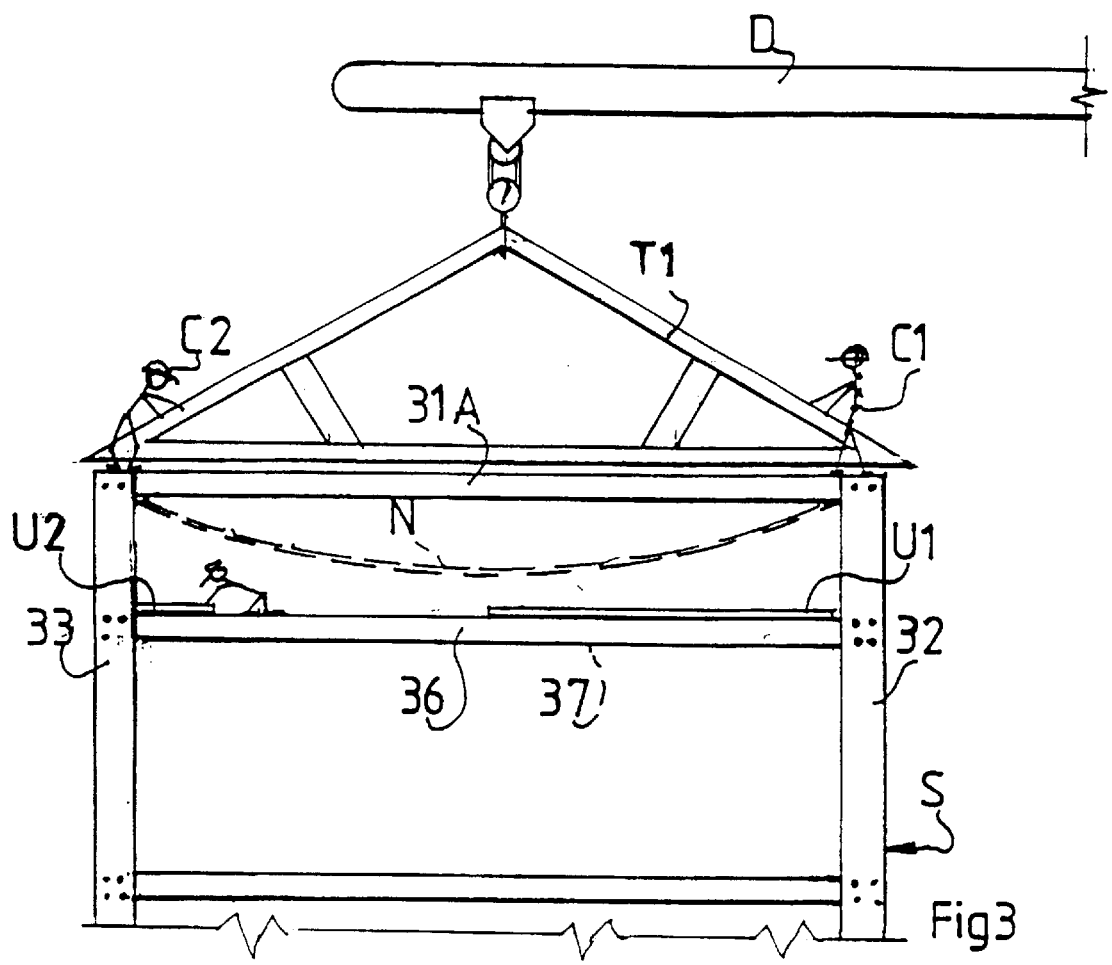
FIG. 3 is an end elevation view of a partially erected building structure incorporating the unit of FIGS. 1 and 2.
Figure 4:
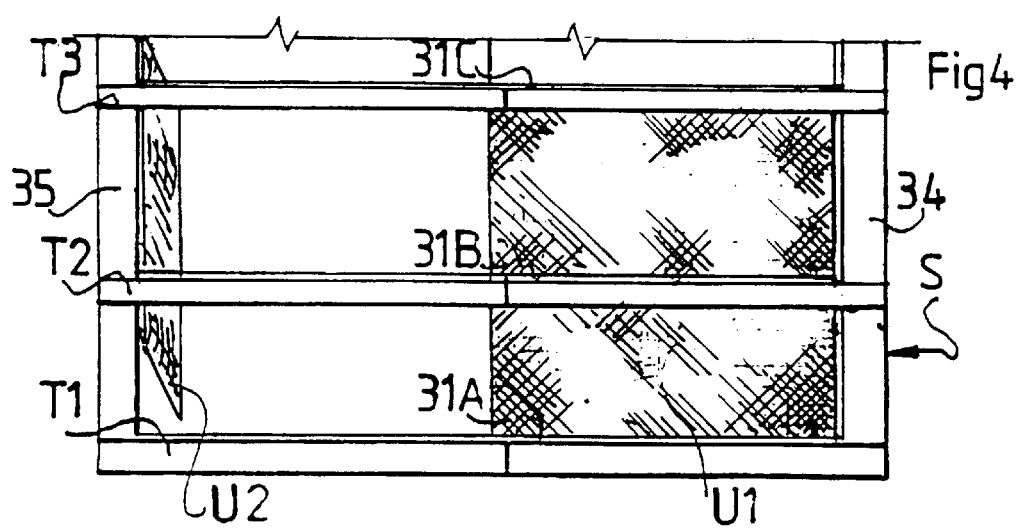
FIG. 4 is a plan view of the structure of FIG. 3.

FIGS. 3 and 4 show the erected framework S for a building with upper frame member 31A to 31C and vertical end frame members 32, 33.

A sequence of trusses (T1 to T3 FIG. 4) are shown in their final positions. FIG. 3 shows an earlier position where only the truss T1 has been lifted initially by means of crane D to a position slightly above its approximate final location on the structure side rails 34, 35. In order to secure them in position operatives C1, C2 manoeuvre the truss T1 into its required final position while the crane D supports the weight of the truss T1. Once in position the crane D lowers the truss T1 onto the side rails 34, 35 where the truss is secured. The truss mounting operation is then repeated for the remaining trusses.

In the exposed position shown at the top of the present skeletal structure S of the building operatives C1, C2 could be liable to loss of balance, however caused. It is known to make use of a cordage net, typically net N (shown in broken outline), to be stretched beneath the area of roof being worked on. In this way apart from limiting, if not preventing, injury to an individual falling individual or equipment beneath the area vertically beneath the working area is protected from falling matter. However it is known that operatives are not necessarily willing to make voluntarily use of a net such as net N since it takes time to position and secure it in place. Such a net further serves to limit the rate at which work can be undertaken and also to impede the ready movement of people, equipment and materials in the vicinity of the net N.

The unit 10 described in connection with FIGS. 1 and 2 are more readily located, secured (if necessary) and used for safety purposes than net N. FIGS. 3 and 4 show the use of two units, U1, U2 located on cross members 36, 37.

Unit U1 is shown having been drawn into position and is then opened out to lie in its opened configuration across beams 36 to 37as shown. The mesh size of the trellis of unit U1 is chosen so as to readily retain any object of any significant size or weight dropped from the roof area within the building structure. If necessary the unit U1 can be readily attached by shock cords or the like to the structure S to provide an anchoring and shock absorbing capacity in addition to the damping action provided by the unit U1 itself.

Unit U2 is shown in its closed configuration taking up little room while being capable of being readily brought into use.

Once the units U1 and U2 have been used they are readily closed and moved to a further location. The unit is not readily damaged by weather or use and can be handled without impeding handling of building equipment or materials. Ready handling is facilitated by the unit being of relatively rigid construction. By virtue of this ready handling, usage and transfer operatives are more, rather than less, disposed to make use of the safety unit of the present invention by comparison with the safety net described earlier which is a floppy non-rigid device which is not readily handled and requires attachment to ensure that the net can be maintained in a configuration over a gap to maintain an ability to catch a falling person.

INDUSTRIAL APPLICABILITY

While the exemplary embodiment describes the safety unit of the present invention used in relation to an operation in the upper part of a building structure it will be apparent that the unit can be used in may locations to protect individuals and equipment. The safety unit described in connection with FIGS. 1 and 2 can be readily adapted for other mounting methods. They can include a series of pegs each secured at or near the ends of members of the trellis and providing for the trellis, at least in its open configuration to be hooked over the edge of a wall or other horizontal member over which the unit passes so as to anchor the local region of the trellis on the wall or member. This serves to prevent inadvertent displacement of the unit when in position.

Alternatively the unit could include more elaborate mounting fitments by means of which the unit can be mounted for support on trestles or scaffolding or to provide for loads suddenly imposed on the unit to be fed into local building structure. A safety unit can also include fasteners to enable two or more units to be readily attached to and disconnected from one another.

The exemplary embodiment shows the safety unit being used in a horizontal configuration and objects falling into the unit tend to lie where they have fallen. However it is also envisaged that the unit can be inclined to some extent from the horizontal so that an object having fallen and been retained the unit can roll away from the centre of the unit to be restrained at or near the periphery so that the central region of the unit is left clear to receive a subsequent falling object without the later object striking the earlier.

What is claimed is:

1. A safety apparatus comprising: a plurality of first parallel members;

a plurality of second parallel members;

a plurality of pivots interconnecting one of the first parallel members to one of the second parallel member to form a self-supporting grid;

the self-supporting grid defining a perimeter having variable length and width dimensions with the self-supporting grid having a larger length dimension when in an open position and a smaller length dimension when in a closed position; and a separate support structure having a perimeter support surface, which lies a horizontal plane, for supporting and maintaining the self-supporting grid, during use as the safety apparatus, in the open position and in a substantially horizontal plane, and the perimeter support surface defining an opening therethrough;

wherein the perimeter of the self-supporting grid is adjustable to a sufficiently large open position so as to cover at least part of the opening of the separate support structure and prevent an object from falling through an opening of the separate support structure, and the self-supporting grid being removable from the separate support structure following use as the safety apparatus;

the adjustable grid perimeter being defined solely by ends of the linked together first and second parallel members without any other boundary members.

2. The safety apparatus as set forth in claim 1, wherein each pivot is a pin coated with plastic rotatably connecting one of the first parallel members to one of the second parallel members at each of the plurality of connections.

3. The safety apparatus as set forth in claim 2, wherein each member of the first and second array is one of a length of plastic extrusion and a length of metal extrusion, and the extrusion having a square cross-section defining a hollow passage along the length of each member.

4. The safety apparatus as set forth in claim 1, wherein the self-supporting grid is secured to the perimeter support surface by temporary mounting fitments in the sufficiently large open position so as to completely cover the opening of the separate support structure and prevent an object from falling through the opening.

5. The safety apparatus as set forth in claim 1, wherein the perimeter of the self-supporting grid is extendable beyond the perimeter support surface so as to completely cover the opening and the perimeter support surfaand prevent an object from falling through the opening.

6. A method of providing for the retention of falling objects at an elevated location, comprising a network or mesh for spreading across an opening through which an object could fall, the method comprising the steps of:

locating at the opening a safety screen in the form of a trellis comprising a first and a second array of parallel rigid members;

linking the first array to the second array so that the majority of members of the first array are pivotably attached to the majority of members of the second array for movement relative to one another between a first, housed, configuration wherein the difference between the width of the trellis and the length tends to a maximum; and a second, opened, configuration wherein the difference between the width of the trellis and its length is a minimum; and supporting the trellis at or near its periphery so as to retain falling objects contacting the trellis in a region lying within the periphery, wherein the adjustable grid perimeter is defined solely by ends of the linked together first and second parallel members without any other boundary members so that the adjustable grid perimeter is not fixedly attached to a surrounding structure.

7. Elevated location as set forth in claim 6 further comprising the step of variably adjusting the width and length of the trellis relative to a separate support structure during use.

8. A safety unit in the form of a network or mesh for location across an opening to receive and restrain an object falling into the opening wherein the network or mesh is in the form of a trellis comprising:

a first array of parallel rigid members;

a second array of parallel rigid members; and pivoting means whereby each member of said first array is pivotably attached to at least a member of said second array so that the first and second arrays can be pivoted relative to one another between;

a first, housed, configuration wherein the difference between the width of the trellis and a length of the trellis tends to a maximum; and a second, opened, configuration wherein the difference between the width of the trellis and the length of the trellis tends to a minimum;

wherein the trellis is adapted for horizontal positioning in at least the opened configuration in a zone into or through which falling objects tend to pass by being supported at or near the periphery of the trellis so as to retain falling objects contracting the trellis in a region lying within the periphery, and wherein the adjustable grid perimeter is defined solely by ends of the linked together first and second parallel members without any other boundary members;

wherein the pivoting means provide for the first and second arrays to, lie in a substantially common plane in the housed and the opened configurations; and wherein the trellis is in the opened configuration and supported at intervals around its periphery so as to provide a tensioned area of the trellis into which a falling object can fall to enable the motion of the failing object to be damped.

* * * * *